United States Patent [19]

Palmer et al.

[11] Patent Number: 6,038,255
[45] Date of Patent: *Mar. 14, 2000

[54] RECEIVER FOR PULSE WIDTH MODULATED TRANSMISSIONS

[75] Inventors: John P. Palmer, Pomona; Mohammad A. Asgari, San Diego; Joseph Tran, West Covina, all of Calif.

[73] Assignee: Ludwig Kipp, Palm Beach, Fla.

[ * ] Notice: This patent issued on a continued prosecution application filed under 37 CFR 1.53(d), and is subject to the twenty year patent term provisions of 35 U.S.C. 154(a)(2).

[21] Appl. No.: 08/881,629

[22] Filed: Jun. 24, 1997

[51] Int. Cl.⁷ .............................. H03K 7/08; H03K 9/08
[52] U.S. Cl. .......................... 375/238; 327/175; 370/212
[58] Field of Search ................................ 327/175, 31, 35, 327/36, 37; 370/212, 213; 375/238, 342, 353, 360, 361, 364; 332/115, 109, 112; 329/312, 313

[56] References Cited

U.S. PATENT DOCUMENTS

| | | |
|---|---|---|
| 3,949,394 | 4/1976 | Kennedy . |
| 4,695,840 | 9/1987 | Darilek . |
| 4,985,640 | 1/1991 | Grochowski et al. ............. 307/269 |
| 5,144,265 | 9/1992 | Petzold .......................... 332/109 |
| 5,315,299 | 5/1994 | Matsumoto ......................... 341/53 |
| 5,345,231 | 9/1994 | Koo et al. . |
| 5,355,137 | 10/1994 | Schurmann . |
| 5,376,922 | 12/1994 | Kiss . |
| 5,436,853 | 7/1995 | Shimohara ....................... 364/569 |
| 5,471,187 | 11/1995 | Hansen et al. . |
| 5,550,499 | 8/1996 | Eitrheim ......................... 327/291 |
| 5,557,280 | 9/1996 | Marsh et al. . |
| 5,638,016 | 6/1997 | Eitrheim ......................... 327/175 |
| 5,847,589 | 12/1998 | Arai et al. ....................... 327/175 |

*Primary Examiner*—Chi H. Pham
*Assistant Examiner*—Jean B Corrielus
*Attorney, Agent, or Firm*—Amster, Rothstein & Ebenstein

[57] ABSTRACT

In a receiver, a system and method are disclosed for providing improved detection of data from a transmitted sequence of pulse width modulated (PWM) pulses. The disclosed system includes a pulse detector having an adjustable critical duty cycle for distinguishing between first and second pulses based upon their respective long and short duty cycles at which they are received. The disclosed system further includes an element which determines the duty cycle of the received pulses and an element which adjusts the critical duty cycle based on the duty cycle which is so determined. The duty cycle may be determined by determining the correspondence between information obtained from an initial pulse sequence and reference information at the receiver. In the disclosed method, the duty cycle of pulses in an initial sequence is first determined and then checked against a predetermined limit. If the duty cycle falls outside the limit, the critical duty cycle is adjusted prior to further pulses being detected.

14 Claims, 6 Drawing Sheets

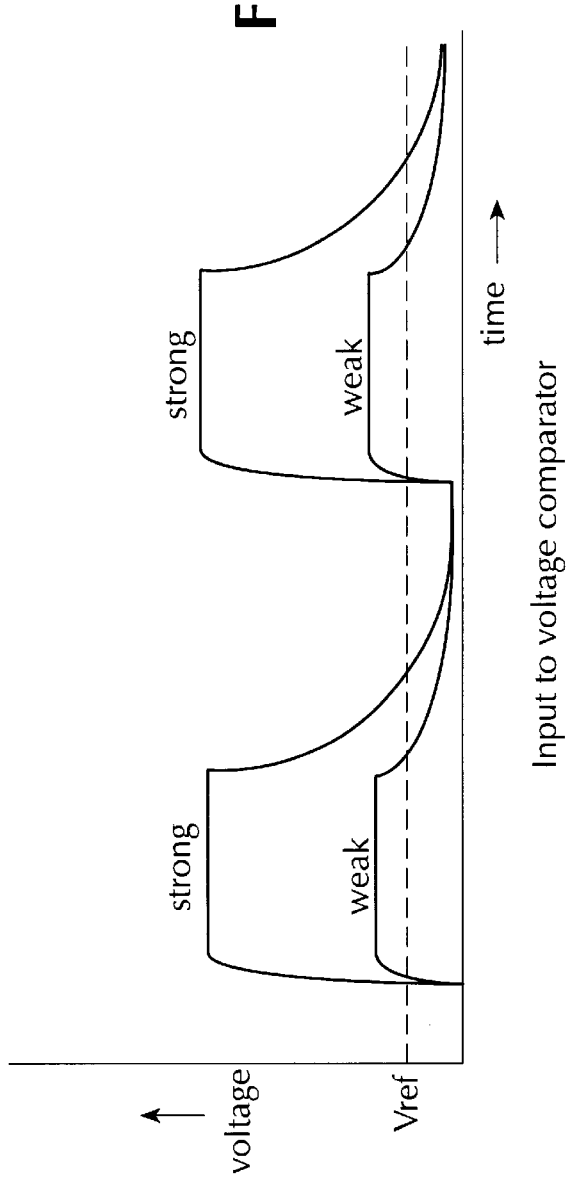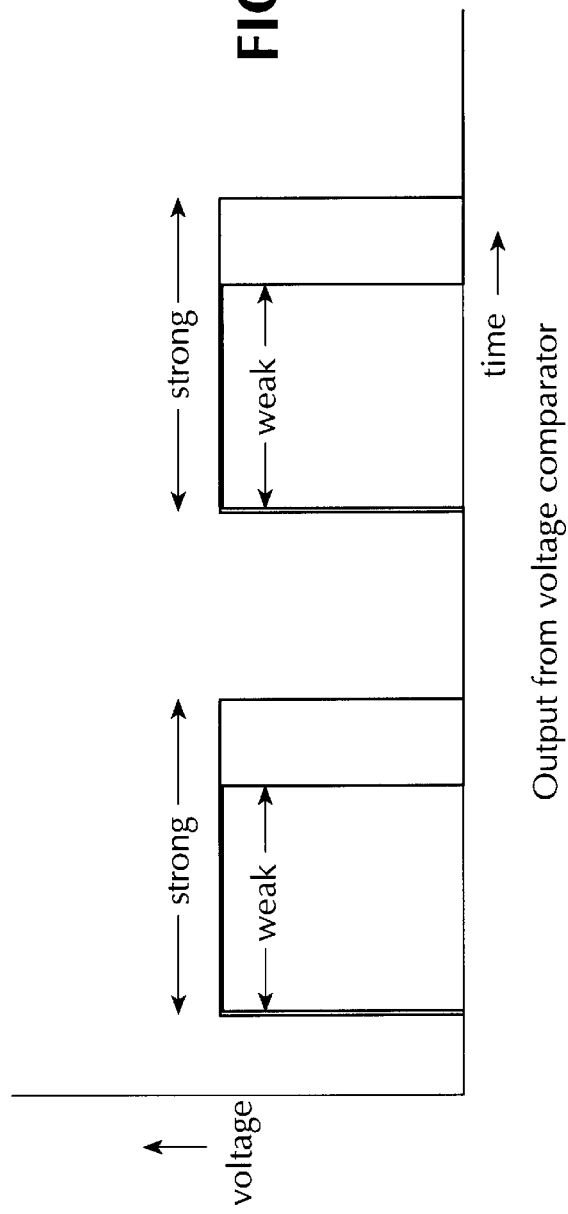

RECEIVER FOR PULSE WIDTH MODULATED TRANSMISSIONS

FIELD OF THE INVENTION

The present invention relates to digital communications and more specifically to a receiver of pulse width modulated (PWM) communications which is adjusted based on a determination of the duty cycle at which PWM encoded pulses are received.

BACKGROUND OF THE INVENTION

The present invention is advantageously applied to a radio frequency communication system such as that described in co-assigned U.S. Pat. No. 5,530,702 ("the '702 Patent") to Palmer et al. which is hereby incorporated by reference. In the system described in the '702 Patent, an interrogator transceiver transmits a BEGIN signal to a group of independently operating data terminals, for example, radio frequency identification (RFID) tags, whereupon each RFID tag transmits an appropriately timed request to transmit (RTT) signal to the interrogator and, when the RTT signal is acknowledged, the RFID tag transmits a data containing signal which is received by the interrogator. As set forth in the system described in the '702 Patent, RFID tags are oriented and positioned randomly with respect to the interrogator at distances which vary by one or more orders of magnitude. As a consequence, the signal strength of transmissions received by the interrogator from more closely positioned RFID tags varies from the received signal strength of transmissions from more distantly positioned tags by several orders of magnitude.

As disclosed in the '702 Patent, each RFID tag transmits digital signals to the interrogator using two-level binary pulse width modulation (PWM), in which logical zeroes are represented by short duration pulses (nominally 33% duty cycle) timed at the beginning of each clock cycle (illustrated, by example, in FIG. 1a), and logical ones are represented by long duration pulses (nominally 67% duty cycle) also timed at the beginning of each clock cycle, as illustrated in FIG. 1b. These digital PWM signals are modulated onto a radio frequency (RF) carrier for transmission to the interrogator transceiver. In the interrogator transceiver (FIG. 2), each transmitted RF signal is demodulated to produce a signal containing pulses of long and short duration. The pulses are provided to a pulse detector which detects a logic state, i.e. "0" or "1", for each pulse, based on the duration of the pulse in relation to a "critical duty cycle" setting of the transceiver. In the exemplary embodiment disclosed in the '702 Patent, the critical duty cycle of a pulse detector of the transceiver is set to 50%, such that pulses having a duty cycle less than 50% are determined to represent the value "0" and pulses having a duty cycle which is greater than 50% are determined to represent the value "1".

In the system disclosed in the '702 Patent, each RFID tag responds at a pseudo-randomly determined time to the BEGIN signal transmitted by the interrogator; the interrogator does not specify in advance or have prior information as to which RFID tag will transmit signals in turn. Therefore, the receiver settings of the interrogator cannot be adjusted prior to receiving the RTT signal from each RFID tag in turn. In the receiver circuitry of the transceiver, illustratively shown in FIG. 2, a demodulator 22 is followed by a voltage comparator 24 for producing a sequence of pulses each having a duty cycle determined by the time in which the signal level lies above a reference voltage Vref 26. As indicated in FIGS. 3a and 3b if the receiver settings of the interrogator transceiver remain the same for receiving both relatively weak and relatively strong signals from RFID tags, the duty cycles of the PWM pulses of the relatively strong signals appear to grow longer, as indicated in FIG. 3b. If no adjustment is made for receiving relatively strong signals, the duty cycle of short duration pulses representing the value "0" could exceed the critical duty cycle (e.g. 50% duty cycle) used to distinguish short duration pulses from long duration pulses and cause the short duration pulses to be indistinguishable therefrom. Accordingly, prior to the herein described invention a need existed for a receiver of PWM signals to adjust such critical duty cycle based on determining an actual duty cycle at which either short duration or long duration pulses are received.

The prior art known to Applicants does not teach a system which fills this need. U.S. Pat. No. 4,695,840 to Darilek ("the Darilek Patent") describes a decoder which determines the duty cycle of a transmitted pulse, which duty cycle encodes a multiple symbol information signal corresponding to the settings of multiple switches in a transmitter. However, the Darilek Patent is only concerned with a single transmitted pulse and does not adjust receiver settings for detecting further transmitted pulses. Moreover, the Darilek Patent does not describe a system which uses a critical duty cycle to distinguish between pulses having different duty cycles.

U.S. Pat. No. 5,471,187 to Hansen et al. ("the Hansen Patent") describes a digital RF transceiver (See FIG. 12) which incorporates a voltage-referenced comparator 305 for determining the transitions between positive and negative pulses of a data signal which is not pulse width modulated. In that described transceiver, the reference voltage level 322 of the comparator 305 is varied in accordance with the strength of the received signal. Not being concerned with the particular problems of receiving pulse width modulated signals, the Hansen Patent does not describe measuring a duty cycle of transmitted pulses or adjusting a critical duty cycle for distinguishing between different transmitted pulses.

Accordingly, it is an object of the invention to provide a system in a receiver which determines a duty cycle at which either first or second pulses of an initially transmitted pulse sequence is received and adjusts a critical duty cycle of a pulse detector in accordance with the duty cycle which is determined.

Another object of the invention is to provide a system in a receiver which determines the duty cycle of pulses by determining correspondence between the information detected therein and reference information at the receiver.

Still another object of the invention is to provide a method for improving detection of a digital PWM signal by determining the duty cycle of either first duration pulses or second duration pulses in an initially transmitted sequence, adjusting a critical duty cycle in the receiver in accordance with the duty cycle which is determined and detecting a further transmitted sequence in accordance with adjusted critical duty cycle.

SUMMARY OF THE INVENTION

These and other objects are addressed by the system of the present invention which provides improved detection of data from a transmitted sequence of pulse width modulated (PWM) pulses. The system of the present invention includes a pulse detector having an adjustable duty cycle for distinguishing between first and second pulses based upon respective first and second duty cycles at which the first and second pulses are received. The pulse detector includes an element operated, e.g. via software or hardware logic, for determining a duty cycle at which either first or second initially transmitted pulses are received. The pulse detector also includes an element operated, e.g. via software or hardware logic, for adjusting the critical duty cycle based upon the duty cycle which has been so determined from the initially transmitted pulses.

In a preferred embodiment, the duty cycle is determined by the pulse detector based on predetermined information content of the initially transmitted pulses. Preferably, the duty cycle is determined by the pulse detector by determining the correspondence between information detected from the initially transmitted pulses and reference information at the receiver. The reference information preferably includes a predetermined sequence of first and second data values which correspond to first and second initially transmitted pulses, respectively.

In another preferred embodiment, the present invention is embodied in a receiver which includes one or more elements for detecting and demodulating a pulse width modulated (PWM) carrier signal to provide a sequence of initially transmitted and further transmitted pulses. The receiver includes a pulse detector having an adjustable critical duty cycle for distinguishing between first and second pulses based upon their respective duty cycles. The receiver further includes an element for determining the duty cycle at which first or second initially transmitted pulses are received, and an element which adjusts the critical duty cycle of the pulse detector based upon the duty cycle which has been determined from the initially transmitted pulses.

The present invention is also embodied in a method for providing improved detection of pulse width modulated (PWM) signals in a receiver. The method includes steps of: determining a duty cycle of either first or second initially transmitted pulses; adjusting a critical duty cycle of the receiver for distinguishing between first and second pulses based on their respective duty cycles; and detecting further transmitted first and second pulses using the adjusted critical duty cycle.

In a preferred embodiment of the method of the present invention, the duty cycle of the initially transmitted pulses is determined based on their predetermined information content. Preferably, the step of determining the duty cycle includes determining the correspondence between information detected from the initially transmitted pulses and reference information at the receiver. Preferably, the correspondence is determined with respect to reference information which includes a predetermined sequence of first and second data values corresponding to first and second initially transmitted pulses.

BRIEF DESCRIPTION OF THE DRAWINGS

FIG. 3a is a graph showing the relationship between a voltage reference and input signals to the voltage comparator shown in FIG. 2.

FIG. 3b is a graph showing the output of the voltage comparator shown in FIG. 2 for relatively strong and relatively weak signals input thereto.

DETAILED DESCRIPTION OF THE PREFERRED EMBODIMENTS

Figure 1A:
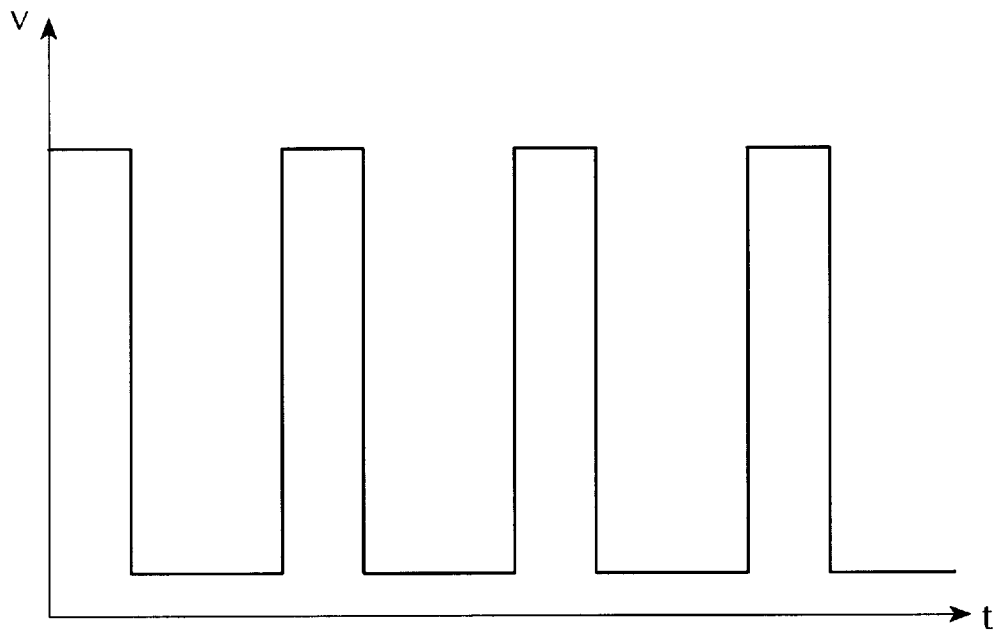
FIG. 1a is a graph showing a sequence of short duration pulses representing logical zeroes.
Figure 1B:
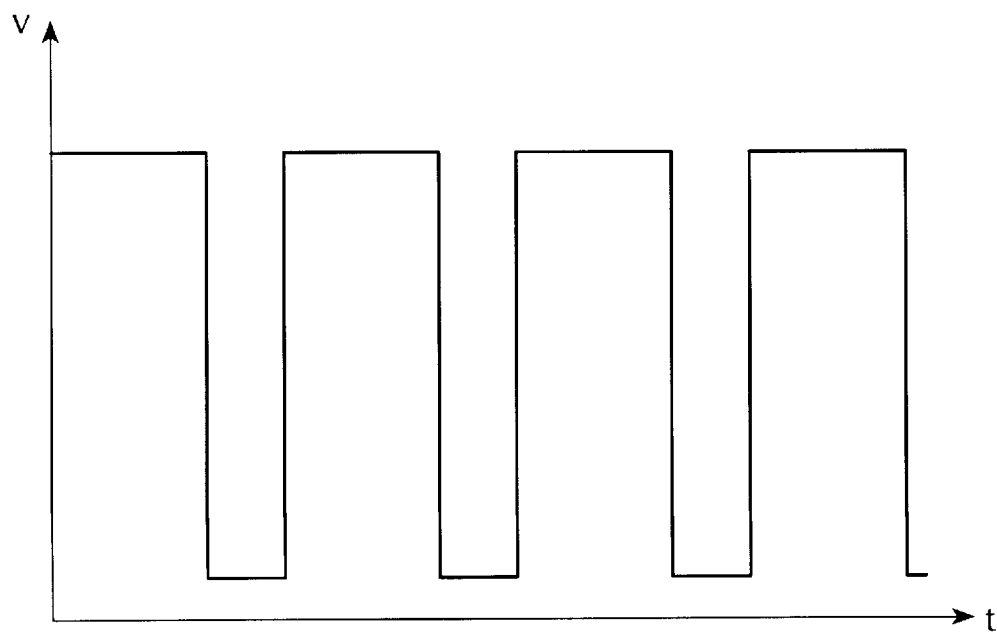
FIG. 1b is a graph showing a sequence of long duration pulses representing logical ones.
Figure 2:
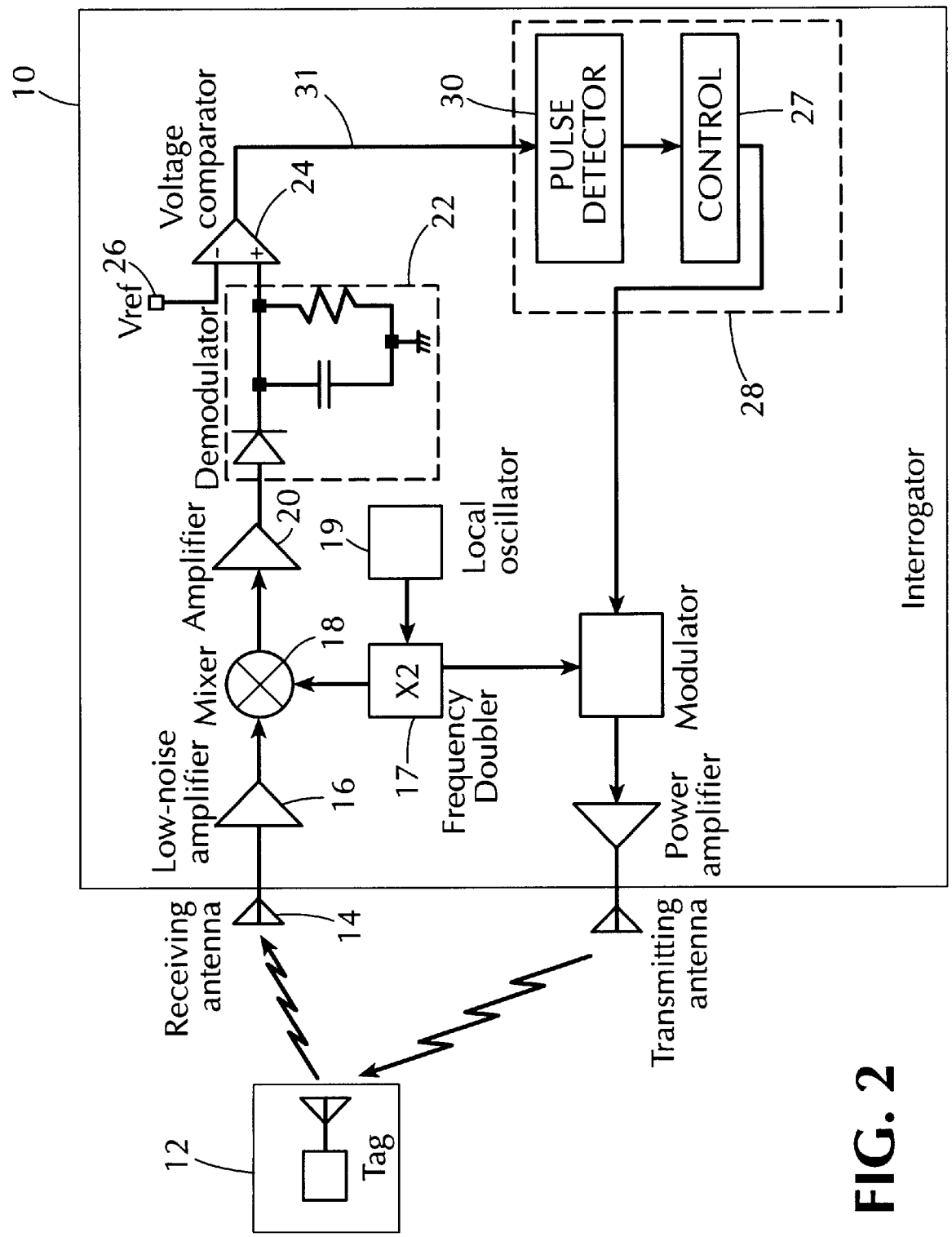
FIG. 2 is a simplified block and schematic diagram showing a receiver embodying the present invention.

FIG. 2 shows a radio frequency (RF) interrogator transceiver 10 and an RFID tag 12 which implement the communication system described in the '702 Patent of Palmer et al., interrogator transceiver 10 of which embodies the present invention. Referring to the receiving circuitry of the interrogator transceiver 10, RF pulse width modulated (PWM) carrier signals are received at an antenna 14 and passed to a mixer 18 through amplifier 16 for down conversion in frequency with a signal from local oscillator 19 as doubled in frequency by frequency doubler 17. The down converted signal is input to demodulator 22 through amplifier 20. Demodulator 22 detects the envelope of the down converted signal and provides that as one input to voltage comparator 24. Voltage comparator 24 compares the transmitted input signal against a reference voltage Vref 26 at a second input to voltage comparator 24.

FIG. 3a shows the results of operation of the receiver circuitry shown in FIG. 2 for the demodulated signal input to voltage comparator 24 for two different cases in which a relatively strong and a relatively weak transmitted signal is received on antenna 14. FIG. 3b shows the results of operation of the receiver circuitry shown in FIG. 2 for the output of voltage comparator 24 for different cases in which a relatively strong and a relatively weak transmitted signal is received on antenna 14. The output of voltage comparator 24 (shown representatively for these different cases in FIG. 3b) is input to a software or logic driven controller 28 including a pulse detector 30.

Figure 4:
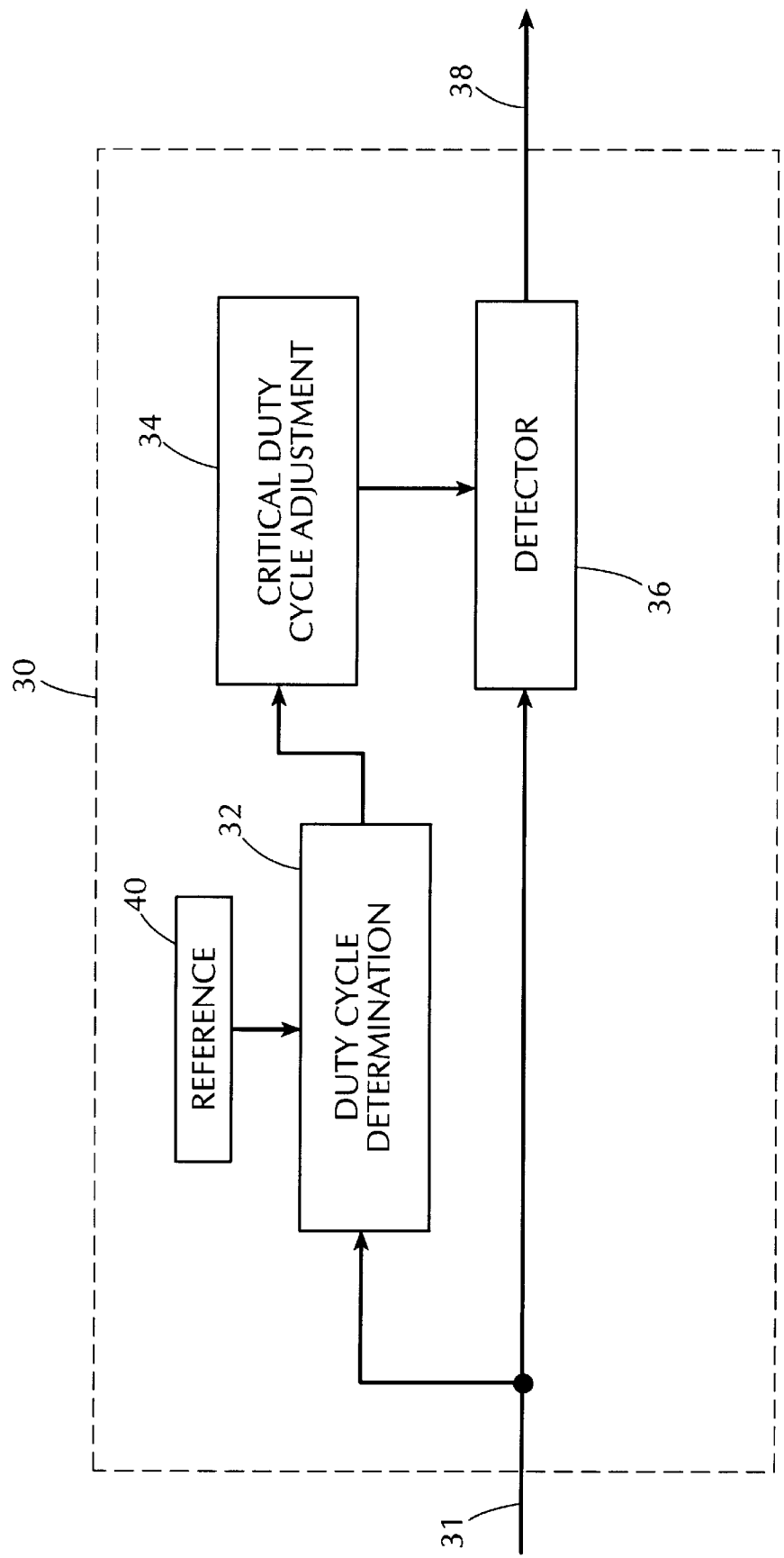
FIG. 4 is a block and schematic diagram showing a pulse detector portion of the system of the present invention.

FIG. 4 shows a detailed block and schematic diagram of a software or hardware logic driven pulse detector 30 for incorporation in a controller 28 in a receiver (FIG. 2) constructed according to the present invention. As shown in FIG. 4, pulse detector 30 includes a detector 36 for distinguishing between pulses of a PWM signal 31 which appears as output of voltage comparator 24 based on the duration of the pulses in relation to a critical duty cycle input thereto. Pulse detector 30 includes a duty cycle determination element 32 which determines the duty cycle of received pulses, and a critical duty cycle adjustment element 34 which adjusts the critical duty cycle used by the detector 36 according to the duty cycle which is determined by element 32.

Duty cycle determination element 32 can be implemented in any of several ways. First, it can be constructed to directly measure the duty cycle of pulses of the PWM input signal 31 using a counter which is driven by a clock in the transceiver 14, or alternatively, which is driven by clocking information derived from the periodicity of the PWM input signal. Alternatively, element 32 may be constructed to detect a predetermined sequence of pulses using a particular setting for the critical duty cycle, and compare the results obtained in relation to reference information stored at the receiver, for example, in element 40. By making appropriate adjustments to the critical duty cycle and repeating the process of detecting and comparing, the correct critical duty cycle can be identified. It will be understood that the reference information may include, for example, a predetermined sequence of first and second data values which correspond to first and second pulses of a PWM signal which are initially transmitted to the receiver in a predetermined sequence.

Figure 5:
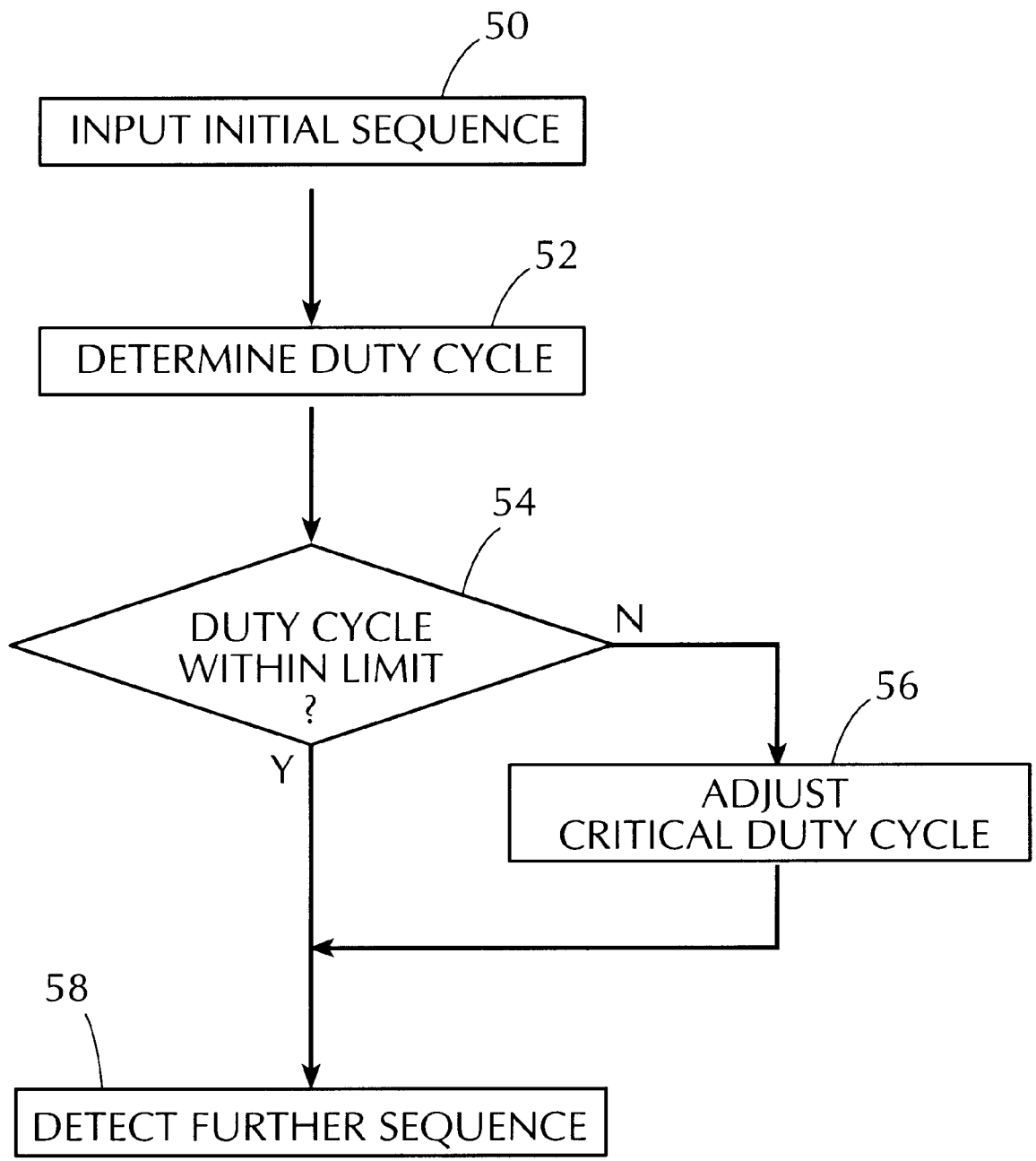
FIG. 5 is a flowchart showing a sequence of operations performed according to an embodiment of the present invention.

FIG. 5 contains a flowchart of operations performed according to a first embodiment of the invention. In this embodiment, an initially transmitted sequence of pulses is input (step 50) to pulse detector 30 as PWM input signal 31 (FIG. 4). The duty cycle of pulses within the initially transmitted sequence having either a first, short duration, or a second, long duration, or pulses of both first and second durations, is determined (step 52) by duty cycle determination element 32. Once the duty cycle of either short duration or long duration pulses, or both has been determined, that duty cycle (or both duty cycles) is checked, in step 54, to determine if it falls within predetermined limits for receiving further PWM pulses.

For example, in the system described in the '702 Patent to Palmer et al. the short duration pulses representing logical zeroes are transmitted with a 33% duty cycle and the long duration pulses representing logical ones are transmitted with a 67% duty cycle. Therefore, to avoid short duration pulses from being falsely detected as logical ones, the duty cycle of incoming short duration pulses representing logical zeroes must not exceed the critical duty cycle.

When the critical duty cycle is nominally set to a 50% duty cycle, it will be understood that the upper limit for the duty cycle of short duration pulses must be less than 50%. Further, when the duty cycle of long duration pulses is checked against the limit but the duty cycle of short duration pulses is not specifically checked, the limit used to check the long duty cycle must be set such that the result intended for the short duration pulses will be achieved. As a specific example, the receiver can be operated to detect an initially transmitted sequence of long duration pulses representing logical ones. If the duty cycle of the long duration pulses is determined to be 67%, such duty cycle matches the nominal duty cycle for the system and necessarily falls within the limit which can be set, for example to 80% duty cycle. Thus, the upper limit for the duty cycle of the long duration pulses must be determined in consideration of the duty cycle which is predicted for short duration pulses when the long duration pulses approach that limit.

If the duty cycle for short duration or long duration pulses in the initially transmitted sequence falls within the predetermined limit, no change is made to the critical duty cycle and further transmitted pulses are detected using the nominal critical duty cycle (step 58). However, if the duty cycle for initially transmitted pulses does not fall within limits, the critical duty cycle for detecting such pulses by the detector 36 is adjusted (step 56) before further transmitted pulses are detected. By adjusting the critical duty cycle, the long and short duration pulses are distinguished from each other with greater accuracy such that the data contained in the PWM input signal 31 is recovered more readily.

Figure 6:
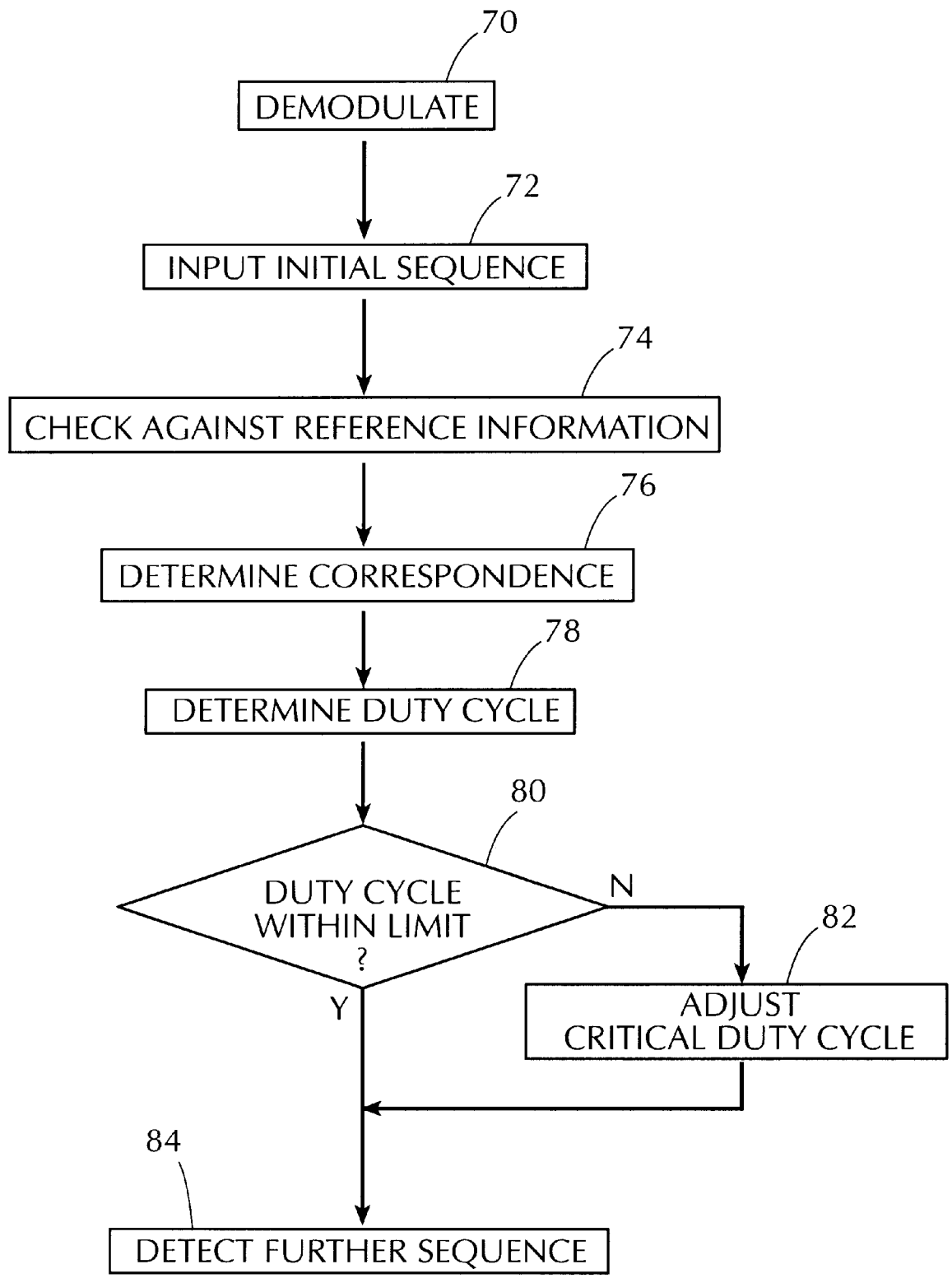
FIG. 6 is a flowchart showing a sequence of operations performed according to another embodiment of the present invention.

FIG. 6 contains a flowchart showing a sequence of operations performed in a preferred embodiment of a receiver constructed in accordance with the invention. As indicated in FIG. 6, a PWM carrier signal is demodulated, in step 70, and provided as an input sequence of initially transmitted pulses (step 72). Within pulse detector 30, the initial sequence is checked against reference information (step 74) provided by element 40 to determine the extent of correspondence (step 76). From the correspondence which is determined, in step 78 the pulse detector determines the duty cycle of pulses within the initially transmitted sequence by element 32. As in the embodiment described above with reference to FIG. 5, the duty cycle which is determined for either the short duration or long duration pulses of the initially transmitted sequence (or both) is checked to determine if it falls within predetermined limit (step 80). If so, no adjustment of the critical duty cycle is made, and a further sequence of pulses, e.g. a variable data containing sequence, is detected by detector 36 (step 84). However, if the duty cycle does not fall within the predetermined limit, element 34 (FIG. 4) adjusts the critical duty cycle for detecting pulses by detector 36 (step 82). In this manner, a further sequence of pulses containing variable data content which results from demodulation of a signal subject to reception at a wide range of amplitudes is detected and the data content is distinguished with greater accuracy.

While the invention has been described in detail herein in accordance with certain preferred embodiments thereof, many modifications and changes therein may be effected by those skilled in the art. Accordingly it is intended by the appended claims to cover all such modifications and changes as fall within the true spirit and scope of the invention.

What is claimed is:

1. A system for providing improved detection of data from a sequence of transmitted pulse width modulated (PWM) pulses received at a receiver, said PWM pulses including first pulses having a first duty cycle representing a logical zero and second pulses having a second duty cycle representing a logical one, said first and second duty cycles being subject to variation at said receiver, said system comprising:

a duty cycle receiver which is responsive to first and second pulses that are initially received at said receiver for determining at least one of said first or said second duty cycles of said pulses initially received at said receiver; and a pulse detector coupled to said duty cycle receiver and having an adjustable critical duty cycle for distinguishing between first and second pulses that are received subsequent to said initially received first and second pulses based upon the respective first and second duty cycles of the subsequently received pulses, said critical duty cycle being adjusted based upon the duty cycle determined in said duty cycle receiver for at least one of said initially received first or second pulses.

2. The system of claim 1 wherein said duty cycle is determined based on predetermined information content of said initially received pulses.

3. A system for providing improved detection of data from a sequence of transmitted pulse width modulated (PWM) pulses received at a receiver, said PWM pulses including first pulses having a first duty cycle representing a logical zero and second pulses having a second duty cycle representing a logical one, said first and second duty cycles being subject to variation at said receiver, said system comprising:

a duty cycle receiver which is responsive to first and second pulses that are initially received at said receiver for determining at least one of said first or said second duty cycles of said pulses initially received at said receiver based on relative correspondence between information detected from said initially received pulses and reference information at said receiver; and a pulse detector coupled to said duty cycle receiver and having an adjustable critical duty cycle for distinguishing between first and second pulses that are received subsequent to said initially received first and second pulses based upon the respective first and second duty cycles of the subsequently received pulses, said critical duty cycle being adjusted based upon the duty cycle determined in said duty cycle receiver for at least one of said initially received first or second pulses.

4. The system of claim 3 wherein said reference information includes a predetermined sequence of first and second data values corresponding to said first and second initially received pulses, respectively.

5. A receiver for providing improved detection of data from a sequence of pulse width modulated (PWM) pulses received at said receiver, said PWM pulses including first pulses having a first duty cycle representing a logical zero and second pulses having a second duty cycle representing a logical one, said first and second duty cycles varying in relation to the received signal strength of said pulses at said receiver, said receiver comprising:

a demodulator for demodulating a PWM modulated carrier signal to produce first and second received pulses;

a duty cycle receiver which is responsive to said first and second pulses that are initially received at said receiver for determining at least one of said first or said second duty cycles of said pulses initially received at said receiver; and a pulse detector coupled to said duty cycle receiver and having an adjustable critical duty cycle for distinguishing between first and second pulses that are received subsequent to said initially received first and second pulses based upon the respective first and second duty cycles of the subsequently received pulses, said critical duty cycle being adjusted based upon the duty cycle determined in said duty cycle receiver for at least one of said initially received first or second pulses.

6. The receiver of claim 5, wherein said duty cycle receiver directly measures the duty cycle of said initially received pulses.

7. The receiver of claim 6, wherein said duty cycle receiver comprises a counter for measuring said duty cycle.

8. The receiver of claim 5, wherein said duty cycle receiver determines at least one of said first or said second duty cycles of said pulses using a predetermined critical duty cycle.

9. The receiver of claim 8, wherein said at least one of said duty cycles is compared to reference information stored in said receiver.

10. A method in a receiver for improving detection of data from a sequence of transmitted pulse width modulated (PWM) pulses received at a receiver, said PWM pulses including first pulses having a first duty cycle and second pulses having a second duty cycle, said first and second duty cycles being subject to variation at said receiver, said method comprising the steps of:

determining at least one of said first or said second duty cycles of said pulses initially received at said receiver;

setting a critical duty cycle of said receiver for distinguishing between first and second received pulses based upon said duty cycle determined for said first or second initially received pulses; and detecting further received first and second pulses at said receiver using said critical duty cycle setting.

11. The method of claim 10 wherein said duty cycle is determined based on predetermined information content of said initially received pulses.

12. The method of claim 10 wherein said duty cycle is determined based on relative correspondence between information detected from said initially received pulses and reference information at said receiver.

13. The method of claim 12 wherein said reference information includes a predetermined sequence of first and second data values corresponding to said first and second initially received pulses, respectively.

14. A method in a receiver for improving detection of data from a transmitted sequence of pulse width modulated (PWM) pulses, said PWM pulses including first pulses having a first duty cycle and second pulses having a second duty cycle, said first and second duty cycles varying in relation to the received signal strength of said pulses at said receiver, said method comprising the steps of:

demodulating a PWM modulated carrier signal to produce first and second received pulses;

determining relative correspondence between information detected from said first and second pulses initially received at said receiver and reference information at said receiver;

determining at least one of said first or second duty cycles from said determination of relative correspondence;

setting a critical duty cycle of said receiver based upon said duty cycle determined for said first or second initially received pulses; and detecting and distinguishing between further received first and second pulses with said critical duty cycle setting.

* * * * *